(12) United States Patent
Chen et al.

(10) Patent No.: US 11,562,935 B2
(45) Date of Patent: Jan. 24, 2023

(54) SEMICONDUCTOR STRUCTURE

(71) Applicant: TAIWAN SEMICONDUCTOR MANUFACTURING COMPANY LTD., Hsinchu (TW)

(72) Inventors: Hsien-Wei Chen, Hsinchu (TW); Ching-Jung Yang, Taoyuan County (TW); Ming-Fa Chen, Taichung (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 273 days.

(21) Appl. No.: 15/895,358

(22) Filed: Feb. 13, 2018

(65) Prior Publication Data
US 2019/0139842 A1 May 9, 2019

Related U.S. Application Data

(60) Provisional application No. 62/582,592, filed on Nov. 7, 2017.

(51) Int. Cl.
*H01L 23/13* (2006.01)
*H01L 23/29* (2006.01)
(Continued)

(52) U.S. Cl.
CPC ............ *H01L 23/13* (2013.01); *H01L 23/293* (2013.01); *H01L 23/3121* (2013.01); *H01L 23/5389* (2013.01); *H01L 24/13* (2013.01); *H01L 24/24* (2013.01); *H01L 24/32* (2013.01); *H01L 24/73* (2013.01); *H01L 25/0652* (2013.01); *H01L 23/147* (2013.01); *H01L 23/15* (2013.01); *H01L 23/3128* (2013.01);

*H01L 23/36* (2013.01); *H01L 2224/13024* (2013.01); *H01L 2224/13025* (2013.01); *H01L 2224/24137* (2013.01);
(Continued)

(58) Field of Classification Search
CPC ....... H01L 23/13; H01L 23/147; H01L 23/15; H01L 23/293; H01L 23/3121; H01L 23/5389; H01L 24/13; H01L 24/24; H01L 24/32; H01L 24/73
See application file for complete search history.

(56) References Cited

U.S. PATENT DOCUMENTS

| 8,034,661 | B2 * | 10/2011 | Lin | ........................ H01L 21/568 257/E21.503 |
| 9,524,959 | B1 * | 12/2016 | Yeh | ........................ H01L 23/5226 |
| 10,134,689 | B1 * | 11/2018 | Sridharan | ............. H01L 23/562 |
| 2003/0045028 | A1 * | 3/2003 | Tsao | .................. H01L 23/49816 438/108 |

(Continued)

OTHER PUBLICATIONS

Hopcroft, "What is the Young's Modulus of Silicon?"—J. of Microelectromechanical Systems, vol. 19, No. 2, Apr. 2020, pp. 229-238. (Year: 2020).*

(Continued)

*Primary Examiner* — Syed I Gheyas
(74) *Attorney, Agent, or Firm* — WPAT Law; Anthony King

(57) ABSTRACT

The present disclosure provides a semiconductor structure including a substrate, a first die vertically over the substrate, a second die vertically over the substrate and laterally separated from the first die with a gap, and an insulation material in the gap. The substrate is at least partially overlapped with the gap when viewed from a top view perspective, and a Young's modulus of the substrate is higher than that of the insulation material.

20 Claims, 7 Drawing Sheets

(51) Int. Cl.
*H01L 23/00* (2006.01)
*H01L 23/31* (2006.01)
*H01L 23/538* (2006.01)
*H01L 25/065* (2006.01)
*H01L 23/14* (2006.01)
*H01L 23/15* (2006.01)
*H01L 23/36* (2006.01)

(52) U.S. Cl.
CPC ............... *H01L 2224/24146* (2013.01); *H01L 2224/24265* (2013.01); *H01L 2224/29188* (2013.01); *H01L 2224/32225* (2013.01); *H01L 2224/73209* (2013.01); *H01L 2224/73267* (2013.01); *H01L 2924/10161* (2013.01); *H01L 2924/182* (2013.01)

(56) References Cited

U.S. PATENT DOCUMENTS

| | | | | |
|---|---|---|---|---|
| 2015/0001685 A1* | 1/2015 | Chung | .................... | H01L 24/94 257/621 |
| 2015/0130045 A1* | 5/2015 | Tseng | .................. | H01L 23/3737 257/712 |
| 2015/0371951 A1* | 12/2015 | Yeh | .................... | H01L 25/0655 257/774 |

OTHER PUBLICATIONS

File:///C:/Users/sgheyas/Documents/e-Red%20Folder/15895358/Polyimide_Properties.pdf (Year: 2011).*

* cited by examiner

SEMICONDUCTOR STRUCTURE

PRIORITY CLAIM AND CROSS-REFERENCE

This application claims the benefit of U.S. provisional application Ser. No. 62/582,592 filed on Nov. 7, 2017 and entitled "Semiconductor Structure and Manufacturing Method Thereof", the disclosure of which is hereby incorporated by reference in its entirety.

BACKGROUND

Electronic equipment using semiconductor structures is essential for many modern applications. With the advancement of electronic technology, the semiconductor structures are becoming steadily compact while having greater functionality and greater amounts of integrated circuitry. With the increasing functionality and compact scale of the semiconductor structure, numerous manufacturing operations are implemented with increased complexity.

The manufacturing, operations of the semiconductor structure involve many steps and operations on a compact and thin semiconductor structure. The manufacturing of the semiconductor structure in a miniaturized scale is becoming increasingly complicated. An increase in complexity of manufacturing the semiconductor structure may result in deficiencies such as poor electrical interconnection, delamination of components, or other issues, resulting in a high yield loss of the semiconductor structure and increase of manufacturing cost. As such, there are many challenges for modifying a structure of the semiconductor structures and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
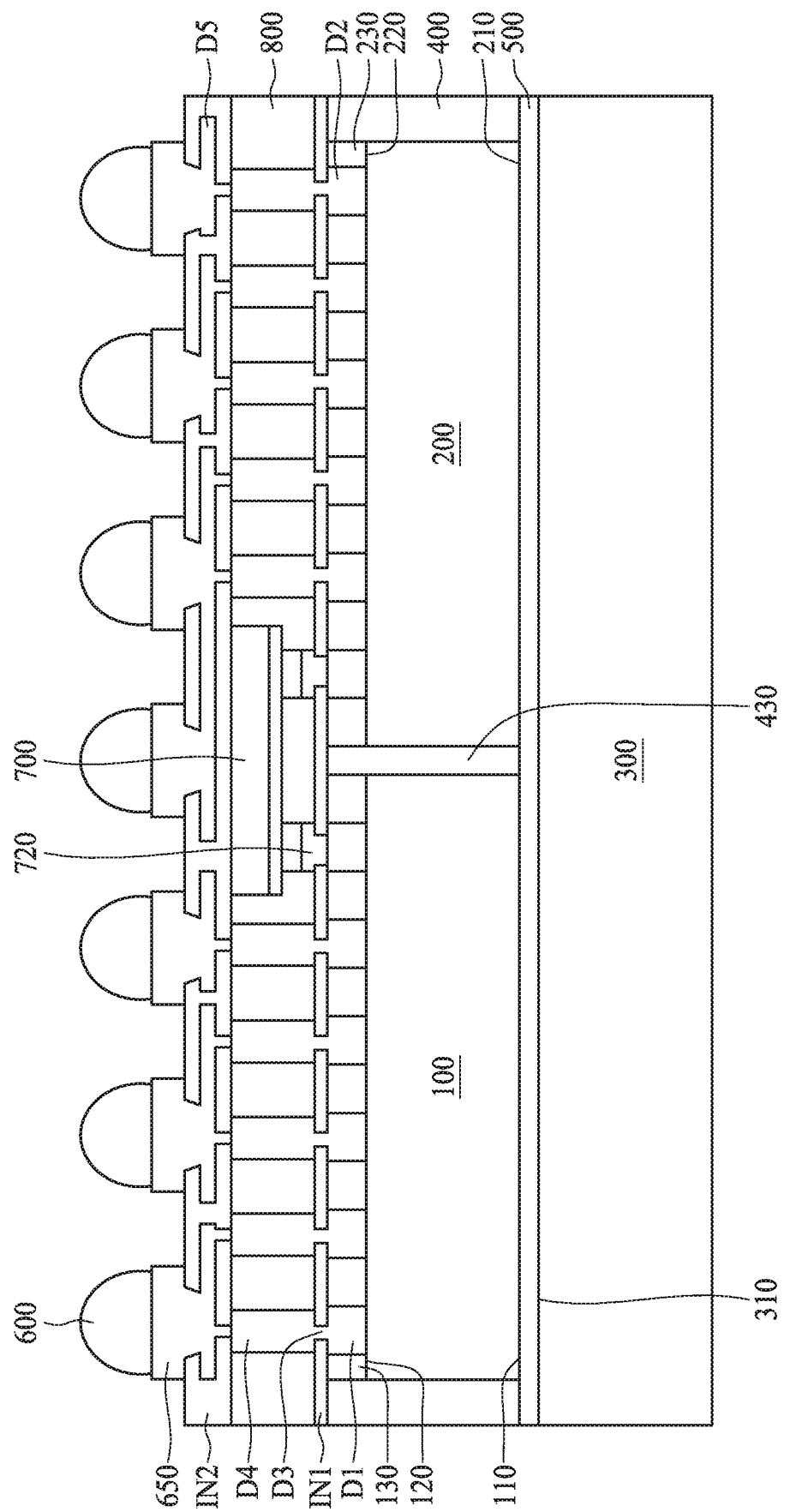
FIG. 1 is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled," and the term "connected" may be termed as "electrically connected." "Coupled" and "connected" may also be used to indicate that two or more elements cooperate or interact with each other.

Other features and processes may also be included. For example, testing structures may be included to aid in the verification testing of 3D packaging or 3DIC devices. The testing structures may include, for example, test pads formed in a redistribution layer or on a substrate that allows the testing of the 3D packaging or 3DIC device, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

With the advancement of electronic technology, semiconductor or package structures are becoming steadily compact while having greater functionality and greater amounts of integrated circuitry. A compact semiconductor structure requires the dies inside the structure to be thin. However, thin dies may lead to warpage issue, for example, where each die or a combination of several dies is asymmetrical or not in a square shape when viewed from a top view perspective. The issue may be a warpage occurring during various processes of the manufacturing of the semiconductor structure, or may remain as an inherent residual stress within the semiconductor structure that might result in a warpage during subsequent processing, such as a reliability testing process or a mounting process of the semiconductor structure on another structure.

The warpage issue may further lead to poor electrical connection or failure of the semiconductor structure. For example, the warpage may result in a crack between two dies that further results in failure of other elements such as another electronic device or an interconnect structure, especially when the material between the dies has less stiffness or a lower Young's modulus compared to that of the dies. In another example, the warpage may cause a poor joint problem, such as cold joint, when the semiconductor structure is mounted on a substrate by, for example, controlled collapse chip connection (C4) bumps.

In some embodiments of the present disclosure, a semiconductor structure is disclosed. The semiconductor structure includes a substrate, a first die vertically over the substrate, a second die vertically over the substrate and laterally separated from the first die, and an insulation material between the first die and the second die. The substrate is at least partially overlapped with the insulation material from a top view perspective, and a Young's modulus of the substrate is higher than that of the insulation material. In some embodiments, by arranging the substrate under the dies and overlapped with the gap, the substrate can support the combination of the dies and reduce the possibility of warpage occurring in the structure. A substrate having a square shape from a top view perspective may have better performance regarding preventing warpage.

FIGS. 1 to 4 are examples of cross-sectional views of a semiconductor structure 1 in accordance with some embodiments of the present disclosure. The semiconductor structure 1 includes a substrate 300, a first die 100, a second die 200, a bonding layer 500, a first insulation material 400, a second insulation material 800, an electronic device 700, a first interconnect layer IN1, a second interconnect layer IN2 and several conductive bumps 600. In me embodiments, the semiconductor structure 1 is a semiconductor package. In some embodiments, the semiconductor structure 1 is a multi-dimensional package such as a 3-dimensional package. In some embodiments, the semiconductor structure 1 is a part of an integrated fan-out (InFO) package. In some embodiments, the semiconductor structure 1 is a part of a chip on wafer (CoW) structure or a chip on wafer on substrate (CoWoS) structure.

In some embodiments, the substrate 300 comprises silicon. In some embodiments, the substrate 300 has a stiffness greater than that of the first insulation material 400. In some embodiments, the substrate 300 has a higher Young's modulus than that of the first insulation material 400. In some embodiments, the substrate 300 has a Young's modulus between about 100 GPa and about 200 GPa. In some embodiments, the substrate 300 has a Young's modulus between about 130 GPa and about 185 GPa. In some embodiments, the substrate 300 has a coefficient of thermal expansion (CTE) lower than that of the first insulation material 400. In some embodiments, the substrate 300 has a CTE of about $3 \times 10^{-6}/°$ C. In some embodiments, the substrate 300 is a bulk silicon. In some embodiments, the substrate 300 is symmetrical when viewed from a top view perspective. In some embodiments, the substrate 300 has a rectangular shape, such as square, when viewed from a top view perspective. In some embodiments, the substrate 300 has an oval or circular shape when viewed from a top view perspective. In some embodiments, the substrate 300 comprises glass. In some embodiments, the substrate 300 is configured to support the semiconductor structure 1 in order to reduce warpage. In some embodiments, the substrate 300 is configured to improve thermal dissipation for the semiconductor structure 1. In some embodiments, a substrate 300 having a symmetrical shape when viewed from a top view perspective can provide better support to the semiconductor structure 1 and reduce warpage. In some embodiments, a substrate 300 having a square or circular shape when viewed from a top view perspective can provide even better support to the semiconductor structure 1 and reduce warpage.

Figure 4:
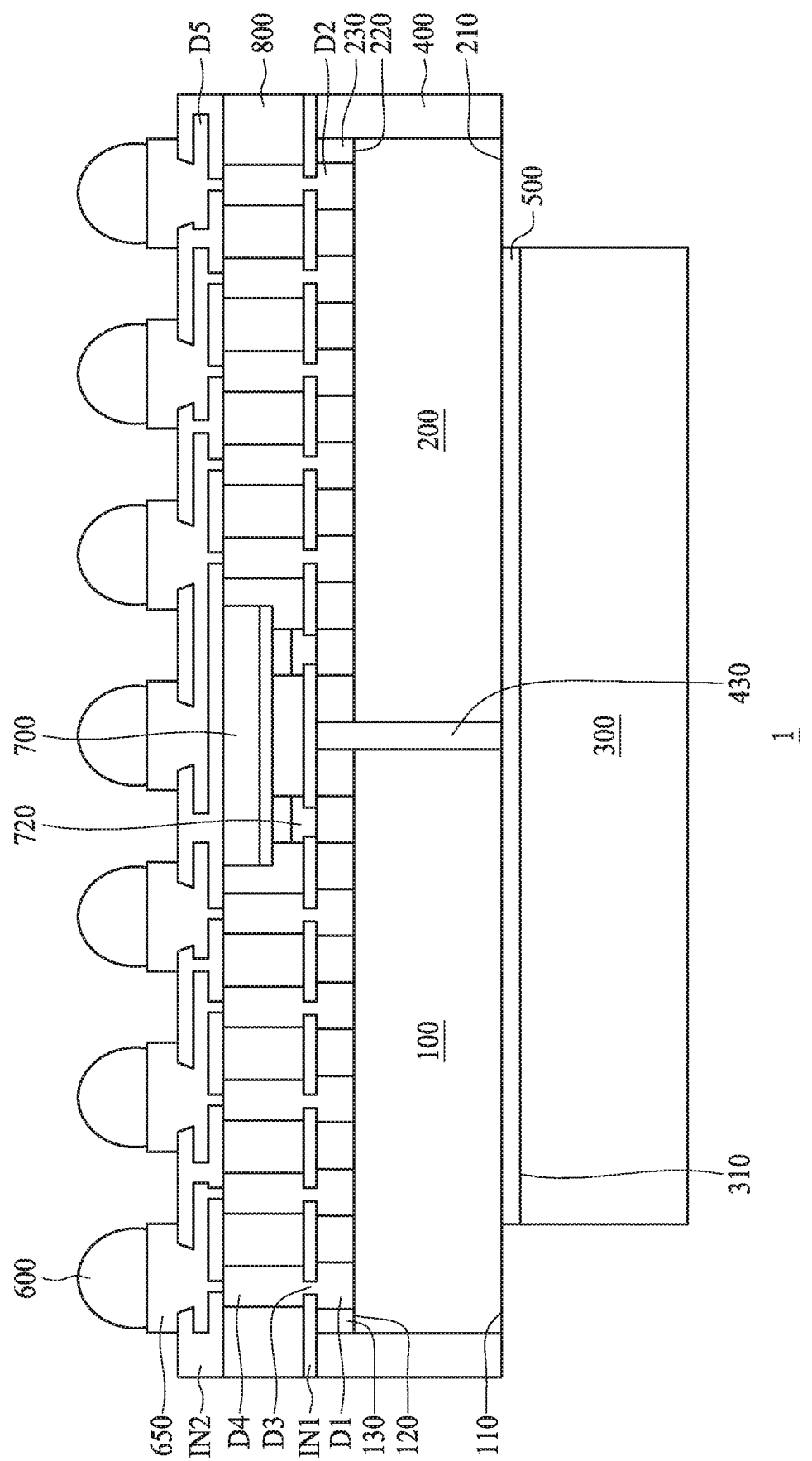
FIG. 4 is a cross-sectional view of a semiconductor structure in accordance with some embodiments of the present disclosure.

As shown in FIG. 1, in some embodiments, the first die 100 is disposed vertically over the substrate 300. In some embodiments, the first die 100 is disposed on the substrate 300. In some embodiments, a portion of the first die 100 is above the substrate 300, while another portion of the first die extends laterally beyond an edge of the substrate 300 such that the another portion of the first die does not overlap the substrate 300 when viewed from a top view perspective, as shown in FIG. 4. In some embodiments, the first die 100 comprises semiconductive materials such as silicon, and the first die 100 is fabricated with a predetermined functional circuit included within the first die 100, wherein the predetermined functional circuit is produced by operations such as photolithography, etching, deposition, etc. In some embodiments, the first die 100 is singulated from a silicon wafer by a mechanical blade or a laser blade. In some embodiments, the first die 100 is a chip, a device or the like. In some embodiments, the first die 100 comprises a variety of electrical circuits suitable for a particular application. In some embodiments, the electrical circuits include various devices such as transistors, capacitors, resistors, diodes and/or the like. In some embodiments, the first die 100 has a top-view cross section (i.e., a cross section of the semiconductor structure 1 as viewed from a top view perspective) having a quadrilateral, a rectangular or a square shape.

In some embodiments, the second die 200 is disposed vertically over the substrate and laterally separated from the first die 100. In some embodiments, the second die 200 is laterally separated from the first die 100 with a gap 430. In some embodiments, the substrate 300 is at least partially overlapped with the gap 430 when viewed from a top view perspective. In some embodiments, the gap 430, a portion of the first die 100 and a portion of the second die 200 are overlapped with the substrate 300 when viewed from a top view perspective, wherein the portion of the first die 100 and the portion of the second die 200 are next to the gap 430. In some embodiments, the second die 200 is disposed on the substrate 300. In some embodiments, a portion of the second die 200 is above the substrate 300, while another portion of the second die extends laterally beyond an edge of the substrate 300, such that the another portion of the second die does not overlap the substrate 300 when viewed from a top view perspective, as shown in FIG. 4. In some embodiments, the second die 200 comprises semiconductive materials such as silicon, and the second die 200 is fabricated with a predetermined functional circuit included within the second die 200, wherein the predetermined functional circuit is produced by operations such as photolithography, etching, deposition, etc. In some embodiments, the second die 200 is singulated from a silicon wafer by a mechanical blade or a laser blade. In some embodiments, the second die 200 is a chip, a device or the like. In some embodiments, the second die 200 comprises a variety of electrical circuits suitable for a particular application. In some embodiments, the electrical circuits include various devices such as transistors, capacitors, resistors, diodes and/or the like. In some embodiments, the second die 200 has a top-view cross section (i.e., a cross section of the semiconductor structure 1 from a top view perspective) having a quadrilateral, a rectangular or a square shape. In some embodiments, the substrate 300 is configured to support the first die 100 and/or the second die 200, in order to prevent warpage from occurring to the first die 100 and/or the second die 200, thus preventing a crack from occurring in, for example, the first die 100, the second die 200 or the gap 430. In some embodiments, a crack might occur within the semiconductor structure 1 due to warpage resulting from various processes, such as a reliability test process.

In some embodiments, a first dielectric 130 is disposed on a side of the first die 100. The side of the first die 100 faces away from the substrate 300. In some embodiments, several conductors D1 are disposed in the first dielectric 130. In some embodiments, the conductors D1 are electrically connected to the first die 100. In some embodiments, the conductors D1 are exposed through a side of the first dielectric 130. The side of the first dielectric 130 faces away from the first die 100, in some embodiments, the conductor D1 has a cylindrical shape. In some embodiments, the conductor D1 is a Cu via.

In some embodiments, a second dielectric 230 is disposed on a side of the second die 200. The side of the second die 200 faces away from the substrate 300. In some embodiments, several conductors D2 are disposed in the second dielectric 230. In some embodiments, the conductors D2 are electrically connected to the second die 200. In some embodiments, the conductors D2 are exposed through a side of the second dielectric 230. The side of the second dielectric 230 faces away front the second die 200. In some embodiments, the conductor D2 has a cylindrical shape. In some embodiments, the conductor D2 is a Cu via.

In some embodiments, the bonding layer 500 is between the first die 100 and the substrate 300, and between the second die 200 and the substrate 300. In some embodiments, the bonding layer 500 is in contact with the first die 100, the second die 200 and the substrate 300. In some embodiments, the bonding layer 500 fully covers a surface 310 of the substrate 300. The surface 310 faces the first die 100 and the second die 200. In some embodiments, the bonding layer 500 exposes a portion of the surface 310 that is not overlapped with the first die 100 or the second die 200 when viewed from a top view perspective. In some embodiments, the bonding layer 500 exposes a portion of the first die 100 or the second die 200 that is not overlapped with the substrate 300 when viewed from a top view perspective, as shown in FIG. 4. In some embodiments, a portion of the bonding layer 500 is extended laterally beyond an edge of the first die 100 or beyond an edge of the second die 200, and not overlapped with the first die 100 or the second die 200 from a top view perspective. In some embodiments, sidewall or a portion of the bonding layer 500 is laterally exposed between the first insulation material 400 and the substrate 300. In some embodiments, the bonding layer 500 comprises oxide such as silicon oxide. In some embodiments, the bonding layer 500 comprises a die attach film. In some embodiments, the bonding layer 500 comprises metal. In some embodiments, a thickness of the bonding layer 500 is between about 0.1 μm and about 0.2 μm.

Figure 2:
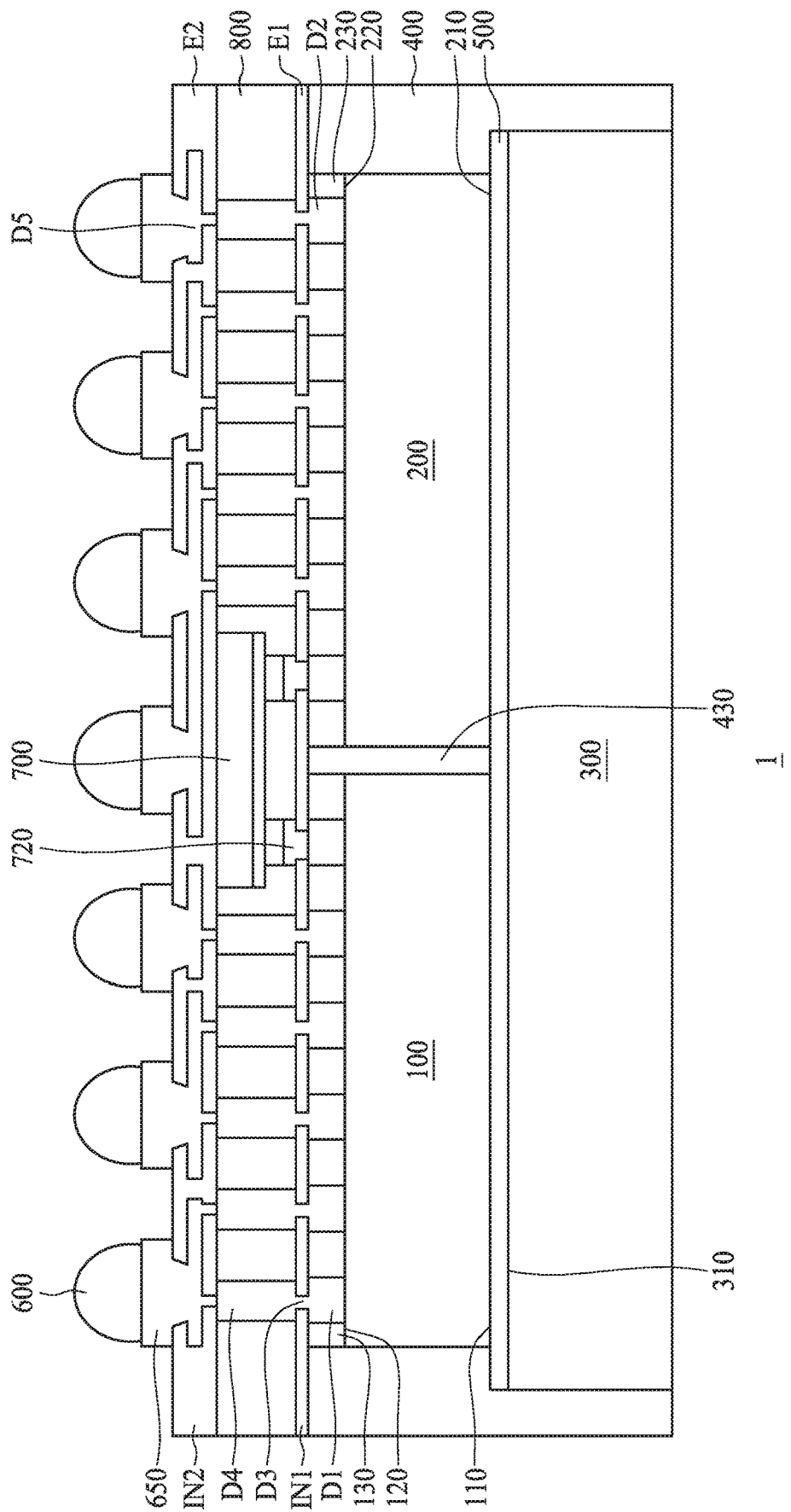
FIG. 2 is a cross-sectional view of a semiconductor structure in accordance with some embodiments of the present disclosure.
Figure 3:
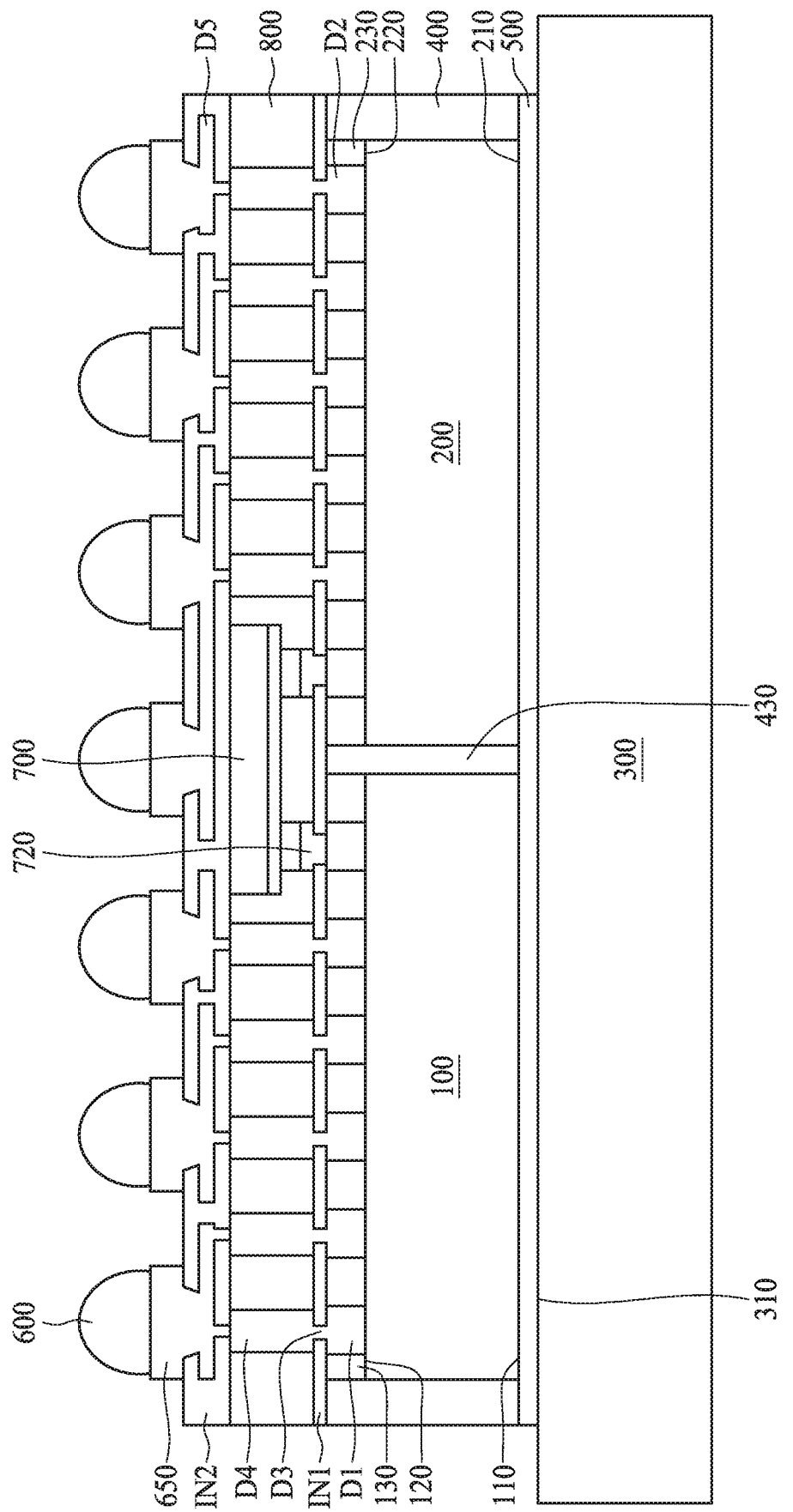
FIG. 3 is a cross-sectional view of a semiconductor structure in accordance with some embodiments of the present disclosure.

In some embodiments, the first insulation material 400 is disposed over the substrate 300. In some embodiments, the first insulation material 400 is disposed on the substrate 300. In some embodiments, the first insulation material 400 is disposed on the bonding layer 500. In some embodiments, the first insulation material 400 is disposed between the first die 100 and the second die 200, and is at least partially overlapped with the substrate 300 from a top view perspective. In some embodiments, the first insulation material 400 fills the gap 430 between the first die 100 and the second die 200. In some embodiments, the first insulation material 400 surrounds the first die 100 and/or the second die 200. In some embodiments, the first insulation material 400 surrounds the first dielectric 130 and/or the second dielectric 230. In some embodiments, the first insulation material 400 surrounds the substrate 300, as shown in FIG. 2. In some embodiments, the first die 100, the second die 200 or the substrate 300 is sealed or embedded in the first insulation material 400. In some embodiments, a portion of the substrate 300 is extended laterally beyond the edge of the first insulation material 400 in such a way that a portion of the substrate 300 is not overlapped with the first insulation material 400 or the bonding layer 500 when viewed from a top view perspective. In some embodiments, the first insulation material 400 has a Young's modulus between about 0.1 GPa and about 50 GPa. In some embodiments, the first insulation material 400 has a Young's modulus between about 1 GPa and about 15 GPa. In some embodiments, a ratio of the substrate 300's Young's modulus to the first insulation material 400's Young's modulus is between about 3 and about 2000. In some embodiments, the first insulation material 400 has a coefficient of thermal expansion (CTE) between about $15 \times 10^{-6}/°$ C. and about $100 \times 10^{-6}/°$ C. In some embodiments, a ratio of the first insulation material 400's CTE to the substrate 300's CTE is between about 5 and about 35. In some embodiments, the first insulation material 400 comprises polymeric material such as resin, ABF resin or epoxy compound.

In some embodiments, a Young's modulus of the substrate 300 is higher than that of the first insulation material 400, such that the substrate 300 can provide better support to the semiconductor structure 1 than the first insulation material 400, thus reducing warpage. In some embodiments, a CIE of the substrate 300 is lower than that of the first insulation material 400, such that the substrate 300 exhibits less thermal extension during various processes than the first insulation material 400, thus keeping the shape of the semiconductor structure 1 stable and preventing warpage. In some embodiments, a CIE of the first die 100 and a CTE of the second die 200 are about the same as the CIE of the substrate 300. In some embodiments, a Young's modulus of the first die 100 and a Young's modulus of the second die 200 are about the same as the Young's modulus of the substrate 300.

In some embodiments, the first interconnect layer IN1 is disposed over the first insulation material 400. In some embodiments, the first interconnect layer IN1 is disposed over the first die 100 or the second die 200. In some embodiments, the first interconnect layer IN1 is disposed on the first insulation material 400, the first dielectric 130 or the second dielectric 230. In some embodiments, the first interconnect layer IN1 comprises several conductors D3 and a dielectric material E1 surrounding the conductors D3. In some embodiments, the conductors D3 are extended through the first interconnect layer IN1. In some embodiments, the conductors D3 are electrically connected to the first die 100 or the second die 200. In some embodiments, the conductors D3 are electrically connected to the first die 100 or the second die 200 through the conductors D1 or D2. In some embodiments, the first interconnect layer IN1 is a redistribution layer (RDL).

In some embodiments, the electronic device 700 is disposed vertically over the first die 100 and the second die 200. In some embodiments, the electronic device 700 is at least partially overlapped with the insulation material 400 between the first die 100 and the second die 200 from a top view perspective. In some embodiments, the electronic device 700 is at least partially overlapped with the gap 430 between the first die 100 and the second die 200 as viewed from a top view perspective. In some embodiments, at least a portion of the electronic device 700 is overlapped with the insulation material 400 between the first die 100 and the second die 200, and is overlapped the substrate from a top view perspective. In some embodiments, at least a portion of the electronic device 700 is overlapped with the gap 430 and the substrate 300. In some embodiments, the electronic device 700 is disposed on the first interconnect layer IN1. In some embodiments, the electronic device 700 is electrically connected to the conductor D1 and/or the conductor D2. In some embodiments, the electronic device 700 is electrically connected to the conductor D1 and/or the conductor D2 by the conductor D3 and/or at least one microbump 720 disposed through the first interconnect layer IN1. In some embodiments, the microbump 720 comprises solder or ENEPIG. In some embodiments, the electronic device 700 is electrically connected to the first die 100 and/or the second die 200. In some embodiments, the electronic device 700 is electrically connected to the first die 100 and/or the second die 200 by the microbump 720, the conductor D3, the conductor D1 and/or the conductor D2. In some embodiments, the electronic device 700 is configured to electrically bridge the first die 100 and the second die 200 with a circuit, pattern (not shown) disposed thereon by semiconductor processes. In some embodiments, the substrate 300 is configured to support the semiconductor structure 1 and reduce warpage, thus preventing a crack that might occur in the gap 430 between the first die 100 and the second die 200 and that might damage the electronic device 700.

In some embodiments, a ratio of a long side to a short side of the electronic device 700 is about 1 to 4. In some embodiments, a ratio of a long side to a short side of the electronic device 700 is about 1 to 2. In some embodiments, a ratio of a long side to a short side of the electronic device 700 is about 1.1. In some embodiments, the electronic device 700 has a die size of about 15×16 mm$^2$.

In some embodiments, the electronic device 700 is a device that includes semiconductive materials such as silicon and is fabricated with a predetermined functional circuit within the electronic device 700 produced by photolithography or any suitable operations. In some embodiments, the electronic device 700 is singulated from a silicon wafer by a mechanical blade or a laser blade. In some embodiments, the electronic device 700 is a chip, a passive device, an active device, a line conductor, a microstrip structure or the like. In some embodiments, the electronic device 700 comprises a variety of electrical circuits suitable for a particular application. In some embodiments, the electrical circuits include various devices such as transistors, capacitors, resistors, diodes and/or the like. In some embodiments, the electronic device 700 includes capacitors, resistors, inductors or the like. In some embodiments, the electronic device 700 is an integrated passive device (IPD). In some embodiments, the electronic device 700 is a logic device, graphics processing unit (GPU), application processing (AP) device, memory device, dynamic random access memory (DRAM) device, static random access memory (SRAM) device, high bandwidth memory (HBM) device, or the like. In some embodiments, the electronic device 700 has a top-view cross section (i.e., a cross section of the semiconductor structure 1 as viewed from a top view perspective) having a quadrilateral, a rectangular or a square shape.

In some embodiments, the second insulation material 800 is disposed over the first interconnect layer IN1. In some embodiments, the second insulation material 800 is disposed on a surface of the first interconnect layer IN1, Wherein the surface of the first interconnect layer IN1 faces away from the substrate 300. In some embodiments, the second insulation material 800 is disposed over the electronic device 700. In some embodiments, a surface of the second insulation material 800 facing away from the substrate 300 is coplanar with a surface of the electronic device 700 facing away from the substrate 300. In some embodiments, a portion of the second insulation material 800 is under the electronic device 700. In some embodiments, a surface of the second insulation material 800 facing toward the substrate 300 is coplanar with a surface of the electronic device 700 facing toward the substrate 300. In some embodiments, a lateral sidewall of the electronic device 700 is exposed through the second insulation material 800. In some embodiments, the second insulation material 800 surrounds the electronic device 700. In some embodiments, the electronic device 700 is embedded in or sealed by the second insulation material 800. In some embodiments, the second insulation material 800 comprises polymeric material such as resin, ABF resin or epoxy compound.

In some embodiments, several conductors D4 are disposed in the second insulation material 800. In some embodiments, the conductors D4 extend through the second insulation material 800. In some embodiments, the conductors D4 are disposed under the electronic device 700. In some embodiments, the conductor D4 is disposed on the microbump 720. In some embodiments, the conductors D4 are electrically connected to the conductors D3 in the first interconnect layer IN1. In some embodiments, the conductor D4 is electrically connected to the electronic device 700 and/or the microbump 720. In some embodiments, the conductor D4 has a cylindrical, hemispherical or spherical shape.

In some embodiments, the second interconnect layer IN2 is disposed over the second insulation material 800. In some embodiments, the second interconnect layer IN2 is disposed over the electronic device 700. In some embodiments, the second interconnect layer IN2 is disposed on the second insulation material 800 and/or the electronic device 700. In some embodiments, the second interconnect layer IN2 surrounds a portion of the electronic device 700. In some embodiments, a portion of the electronic device 700 extends from the second insulation material 800 into the second interconnect layer IN2. In some embodiments, a portion of the electronic device 700 is embedded in or sealed by the second interconnect layer IN2. In some embodiments, the second interconnect layer IN2 comprises several conductors D5 and a dielectric material E2 surrounding the conductors D5. In some embodiments, the conductors D5 extend into the second interconnect layer IN2 vertically, laterally, or in any suitable direction according to the application. In some embodiments, the conductors D5 extend through the second interconnect layer IN2. In some embodiments, the conductors D5 are electrically connected to the conductors D4. In some embodiments, the conductors D5 are electrically connected to the electronic device 700. In some embodiments, the second interconnect layer IN2 is a redistribution layer (RDL).

In some embodiments, the conductive bumps 600 are disposed on the second interconnect layer IN2. In some embodiments, the conductive bumps 600 are electrically connected to the conductors D5. In some embodiments, the conductive bump 600 comprises solder or ENEPIG. In some embodiments, the conductive bump 600 is a controlled collapse chip connection (C4) bump. In some embodiments, the semiconductor structure 1 includes several conductive pads 650 between the conductors D5 and the conductive bumps 600. In some embodiments, the conductive pads 650 electrically connect the conductive bumps 600 to the conductors D5.

Figure 5:
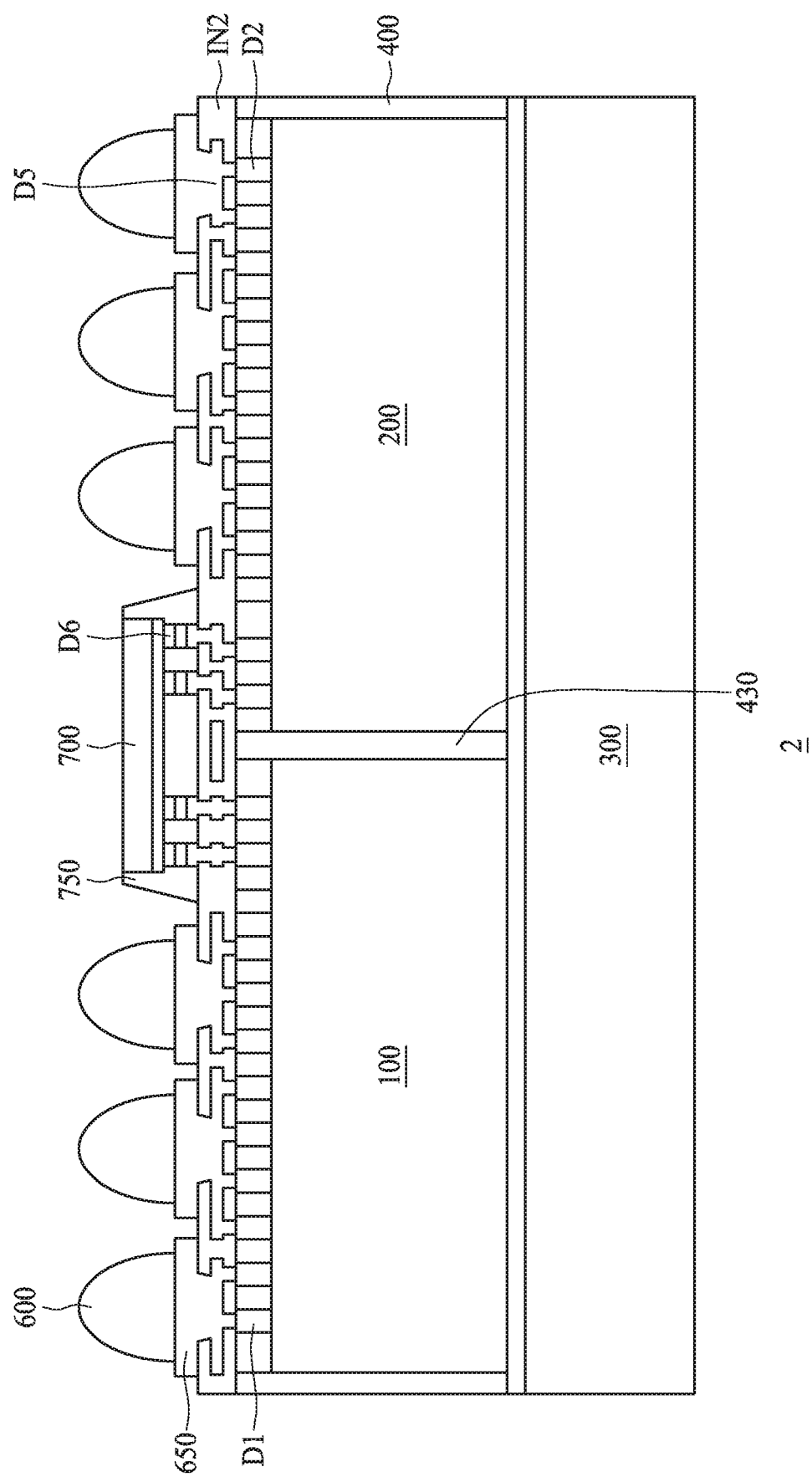
FIG. 5 is a cross-sectional view of a semiconductor structure in accordance with some embodiments of the present disclosure.

FIG. 5 is a cross-sectional view of a semiconductor structure 2 in accordance with me embodiments of the present disclosure. Identical numeral annotations represent identical or similar elements and, for the purpose of brevity, are not repeated herein. A difference between the semiconductor structure 2 and the examples of the semiconductor structure 1 in FIGS. 1 to 4 is that the electronic device 700 of the semiconductor structure 2 is mounted on the second interconnect layer IN2. In some embodiments, the electronic device 700 is laterally surrounded by the conductive bumps 600. In some embodiments, the electronic device 700 is vertically lower titan the conductive bumps 600. In some embodiments, the electronic device 700 is at least partially overlapped with the gap 430 between the first die 100 and the second die 200 from a top view perspective. In some embodiments, at least a portion of the electronic device 700 is overlapped with the gap 430 and the substrate 300.

As shown in FIG. 5, in some embodiments, a third insulation material 750 is disposed around the electronic device 700. In some embodiments, the third insulation material 750 vertically covers the electronic device 700. In some embodiments, the third insulation material 750 is laterally surrounded by the conductive bumps 600. In some embodiments, the third insulation material 750 exposes a surface of the electronic device 700, wherein the surface of the electronic device 700 faces away from the substrate 300. In some embodiments, the electronic device 700 is embedded in or sealed by the third insulation material 750. In some embodiments, several conductors D6 are disposed in the third insulation material 750 to electrically connect the electronic device 700 and the conductors D5. In some embodiments, the electronic device 700 is electrically connected to the first die 100 and the second die 200 by the conductors D6, the conductors D5, the conductors D1, and the conductors D2.

Figure 6:
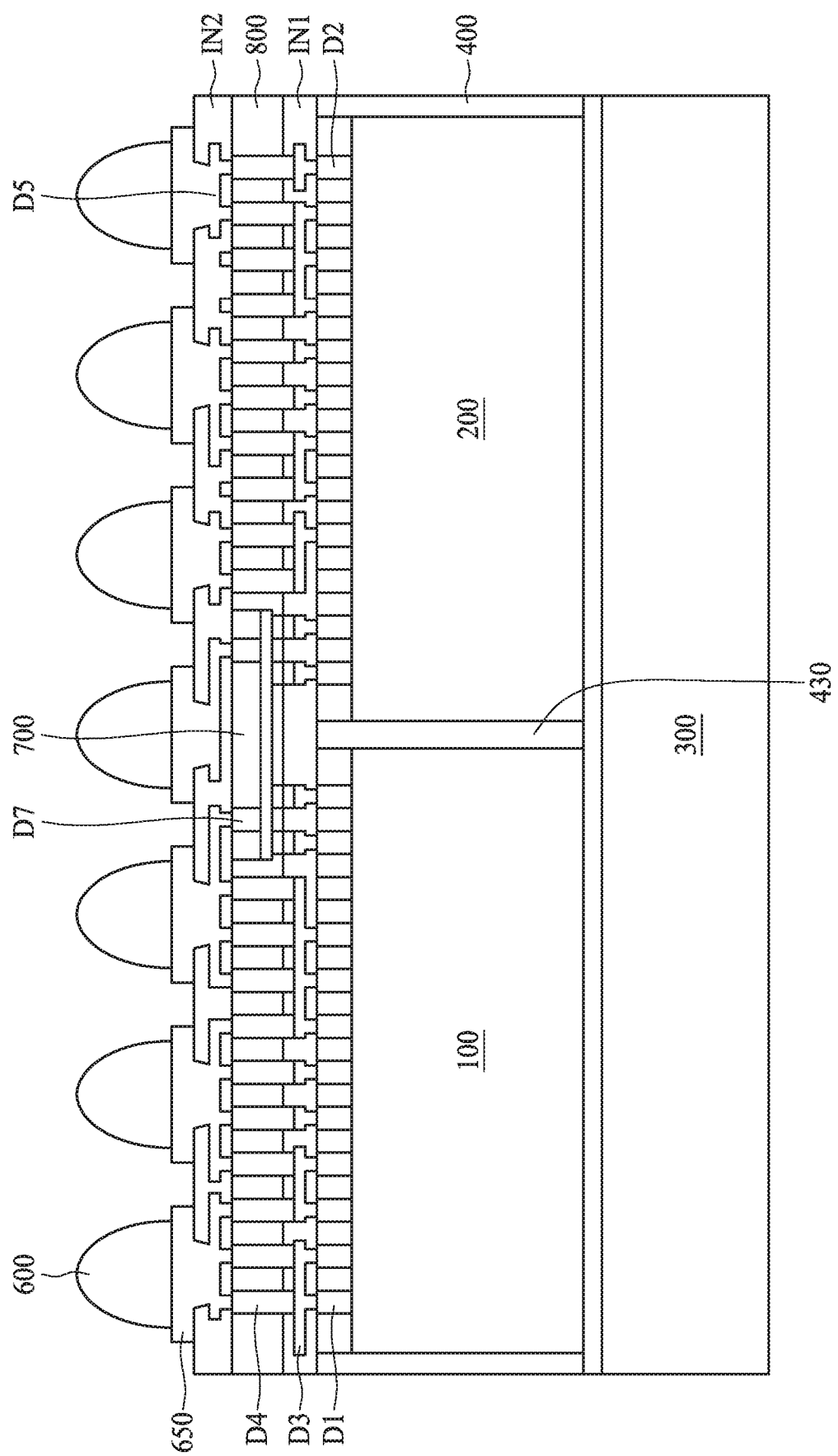
FIG. 6 is a cross-sectional view of a semiconductor structure in accordance with some embodiments of the present disclosure.

FIG. 6 is a cross-sectional view of a semiconductor structure 3 in accordance with some embodiments of the present disclosure. Identical numeral annotations represent identical or similar elements and, for the purpose of brevity, are not repeated herein. A difference between the semiconductor structure 3 and the examples of the semiconductor structure 1 in FIGS. 1 to 4 is that, in the semiconductor 3, several seventh conductors D7 are disposed in the electronic device 700. In some embodiments, the conductors D7 extend through the electronic device 700. In some embodiments, the conductors D7 electrically connect the electronic device 700 to the conductors D5.

Figure 9:
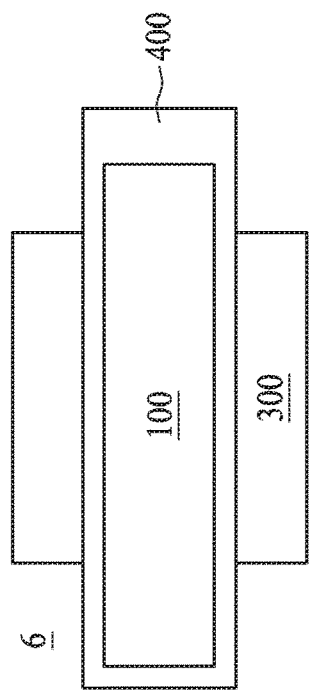
FIG. 9 is a top view of a semiconductor structure in accordance with some embodiments of the present disclosure.
Figure 7:
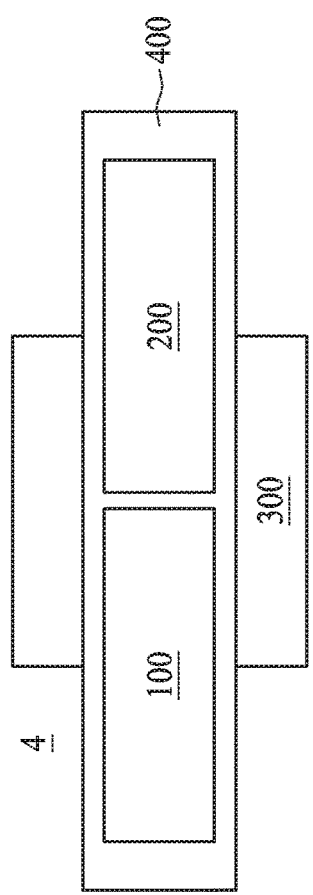
FIG. 7 is a top view of a semiconductor structure in accordance with some embodiments of the present disclosure.
Figure 10:
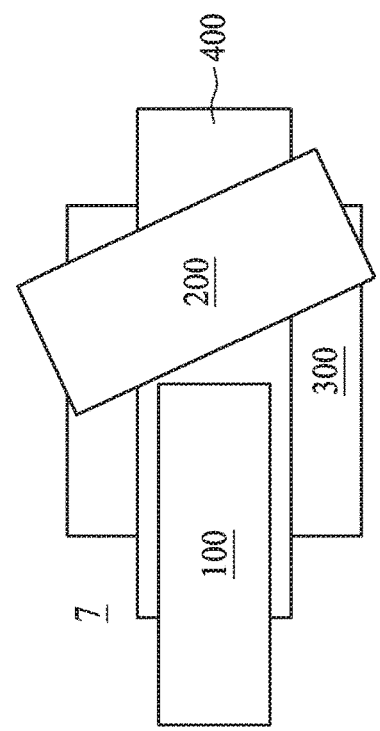
FIG. 10 is a top view of a semiconductor structure in accordance with some embodiments of the present disclosure.
Figure 8:
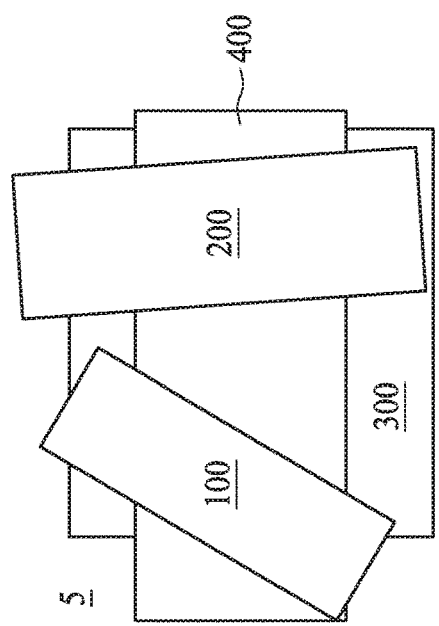
FIG. 8 is a top view of a semiconductor structure in accordance with some embodiments of the present disclosure.

FIG. 7 is a top view of a semiconductor structure 4 in accordance with some embodiments of the present disclosure. FIG. 8 is a top view of a semiconductor structure 5 in accordance with some embodiments of the present disclosure. FIG. 9 is a top view of a semiconductor structure 6 in accordance with some embodiments of the present disclosure. FIG. 10 is a top view of a semiconductor structure 7 in accordance with some embodiments of the present disclosure. Identical numeral annotations represent identical or similar elements and, for the purpose of brevity, are not repeated herein. In some embodiments, one or more dies (100 and/or 200) are disposed vertically over the substrate 300 and laterally arranged. In some embodiments, the first die 100 is adjacent to the second die 200. In some embodiments, a portion of the first die 100 is in contact with a portion of the second die 200. In some embodiments, the first die 100 or the second die 200 is nonsquare when viewed from a top view perspective. In some embodiments, an outline of a combination of the first die 100 and the second die 200 is nonsquare when viewed from a top view perspective. In some embodiments, a short side of the first die 100 faces a short side of the second die 200. In some embodiments, a short side of the first die 100 faces a long side of the second die 200. In some embodiments, a long side of the first die 100 faces a long side of the second die 200. In some embodiments, each of the first die 100 and the second die 200 is at least partially overlapped with the substrate 300 when viewed from a top view perspective. In some embodiments, a ratio of a long side to a short side of the first die 100 or the second die 200 is about 1 to 4. In some embodiments, a ratio of a long side to a short side of the first die 100 or the second die 200 is about 1.5 to 2. In some embodiments, a ratio of a long side to a short side of the first die 100 or the second die 200 is about 1.7. In some embodiments, the first die 100 or the second die 200 has a die size of about 15×25.5 mm$^2$.

In some embodiments, an insulation material 400 surrounds an area between the first die 100 and the second die 200. In some embodiments, the insulation material 400 is between the first die 100 and the second die 200. In some embodiments, the insulation material 400, a portion of the first die 100 adjacent to the insulation material 400, and a portion of the second die 200 adjacent to the insulation material 400 are overlapped with the substrate 300 when viewed from a top view perspective.

Some embodiments of the present disclosure provide a semiconductor structure including a substrate, a first die vertically over the substrate, a second die vertically over the substrate and laterally separated from the first die, and an insulation material between the first die and the second die. The substrate is at least partially overlapped with the insulation material when viewed from a top view perspective, and a Young's modulus of the substrate is higher than that of the insulation material.

Some embodiments of the present disclosure provide a semiconductor structure including a substrate having a symmetrical shape when viewed from a top view perspective, a first die vertically over the substrate, a second die vertically over the substrate and laterally separated from the first die, and an insulation material between the first die and the second die. A coefficient of thermal expansion (CTE) of the substrate is lower than a CTE of the insulation material.

Some embodiments of the present disclosure provide a semiconductor structure including a substrate, a first die vertically over the substrate, a second die vertically over the substrate and laterally adjacent to the first die, and an insulation material between the first die and the second die. The insulation material, a portion of the first die adjacent to the insulation material, and a portion of the second die adjacent to the insulation material are overlapped with the substrate from a top view perspective, and a Young's modulus of the substrate is higher titan that of the insulation material.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a substrate, formed of bulk silicon;
a first die vertically disposed over the substrate;
a second die vertically disposed over the substrate and laterally separated from the first die;
an insulation material between the first die and the second die and filling a gap measured between sidewalls of the first die and the second die;
a bonding layer disposed between the substrate and each of the first die and the second die; and
a first interconnect layer electrically coupled to the first die and the second die on a side of the first die opposite to the substrate, wherein the first interconnect layer electrically couples the first die to the second die, wherein the first interconnect layer has a first width, measured between two opposite sidewalls of the first interconnect layer from a cross-sectional view, greater than a second width of the substrate, measured between two opposite sidewalls of the substrate from a cross-sectional view,
wherein the first width is greater than a third width of the bonding layer, measured between two opposite sidewalls of the bonding layer from a cross-sectional view, wherein the substrate is at least partially overlapped with the gap from a top view perspective and distant from the gap by a thickness of the bonding layer, and a Young's modulus of the substrate is higher than that of the insulation material,
wherein the opposite sidewalls of the bonding layer are aligned with respective opposite sidewalls of the substrate.

2. The semiconductor structure of claim 1, further comprising an electronic device vertically disposed over the first die and the second die, wherein the electronic device is at least partially overlapped with the insulation material from a top view perspective.

3. The semiconductor structure of claim 1, further comprising an electronic device vertically disposed over the first die and the second die, wherein at least a portion of the electronic device is overlapped with the insulation material and the substrate from a top view perspective.

4. The semiconductor structure of claim 1, wherein a shape of the substrate is square from a top view perspective.

5. The semiconductor structure of claim 1, wherein the Young's modulus of the substrate is between about 100 GPa and about 200 GPa.

6. The semiconductor structure of claim 1, wherein the Young's modulus of the substrate is between about 130 GPa and about 185 GPa.

7. The semiconductor structure of claim 1, wherein the substrate comprises silicon.

8. The semiconductor structure of claim 1, wherein the Young's modulus of the insulation material is between about 0.1 GPa and about 50 GPa.

9. The semiconductor structure of claim 1, wherein the Young's modulus of the insulation material is between about 1 GPa and about 15 GPa.

10. The semiconductor structure of claim 1, wherein the insulation material comprises ABF resin or epoxy compound.

11. The semiconductor structure of claim 1, wherein a ratio of the Young's modulus of the substrate to the Young's modulus of the insulation material is between about 3 and about 2000.

12. The semiconductor structure of claim 1, further comprising a second interconnect layer on a side the first interconnect layer opposite to the substrate.

13. The semiconductor structure of claim 1, wherein the bonding layer comprises oxide.

14. The semiconductor structure of claim 1, wherein the insulation material surrounds the first die and the second die.

15. The semiconductor structure of claim 1, wherein the insulation material surrounds the substrate.

16. The semiconductor structure of claim 1, further comprising a plurality of conductors between the first interconnect layer and each of the first die and the second die, wherein the insulation material has a top surface higher than a bottom surface of the conductors.

17. A semiconductor structure, comprising:
a substrate consisting essentially of bulk silicon;
a first die vertically disposed over the substrate;
a second die vertically disposed over the substrate and laterally adjacent to the first die;
an interconnect layer disposed over the first die and the second die;
a bonding layer disposed between the substrate and each of the first die and the second die and comprising a surface extending continuously from the first die to the second die; and
an insulation material filling a gap between the first die and the second die, wherein a first width of the bonding layer measured between two opposite sidewalls of the bonding layer is less than a second width the insulation material measured between two opposite sidewalls on two sides of the insulation material,
wherein the substrate is at least partially overlapped with the gap from a top view perspective, two opposite sidewalls of the substrate are flush with the two opposite sidewalls of the bonding layer, and a Young's modulus of the substrate is higher than that of the insulation material.

18. A semiconductor structure, comprising:
a substrate consisting essentially of silicon;
a first die vertically disposed over the substrate;
a second die vertically disposed over the substrate and adjacent to the first die; and
an insulation material filling a gap between the first die and the second die;

a bonding layer disposed between the substrate and each of the first die and the second die and comprising a surface extending continuously from the first die to the second die; and a first interconnect layer disposed over the first die and the second die, wherein the first interconnect layer has a first width, measured between two opposite sidewalls of the first interconnect layer from a cross-sectional view, greater than a second width of the bonding layer, measured between two opposite sidewalls of the bonding layer from a cross-sectional view, wherein the substrate is partially overlapped with the gap from a top view perspective, wherein the substrate is distant from the gap by a thickness of the bonding layer, two opposite sidewalls of the substrate are flush with the two opposite sidewalls of the bonding layer, and a Young's modulus of the substrate is higher than that of the insulation material.

19. The semiconductor structure of claim 18, wherein the bonding layer covers an entirety of the insulation material between the first die and the second die.

20. The semiconductor structure of claim 18, further comprising a dielectric disposed over the second die and laterally surrounded by the insulation material.

* * * * *